US012666523B2

(12) United States Patent
Choi et al.

(10) Patent No.: US 12,666,523 B2
(45) Date of Patent: Jun. 23, 2026

(54) PROTECTION UNIT AND DISPLAY DEVICE INCLUDING THE SAME

(71) Applicant: Samsung Display Co., Ltd., Yongin-si (KR)

(72) Inventors: Kwang-Wook Choi, Cheonan-si (KR); Kijong Kim, Cheonan-si (KR); Min Ki Kim, Hwaseong-si (KR); Min-Suk Chung, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 228 days.

(21) Appl. No.: 18/159,579

(22) Filed: Jan. 25, 2023

(65) Prior Publication Data

US 2023/0284370 A1     Sep. 7, 2023

(30) Foreign Application Priority Data

Mar. 3, 2022     (KR) ........................ 10-2022-0027633

(51) Int. Cl.
| | |
|---|---|
| *G02F 1/1333* | (2006.01) |
| *G06F 1/16* | (2006.01) |
| *G09F 9/00* | (2006.01) |
| *H05K 1/02* | (2006.01) |
| *H05K 1/189* | (2026.01) |
| *H05K 5/02* | (2006.01) |

(52) U.S. Cl.
CPC ............. *H05K 1/02* (2013.01); *G06F 1/1601* (2013.01); *G06F 1/1637* (2013.01); *G02F 2201/50* (2013.01); *H05K 1/189* (2013.01); *H05K 5/0217* (2013.01); *H05K 2201/10128* (2013.01)

(58) Field of Classification Search
CPC .... G06F 1/1601; G06F 1/1637; G02F 1/1333; G02F 1/133305; G02F 1/133308; G02F 1/133314; G02F 1/133317; G02F 2201/50; H05K 1/189; H05K 1/02; H05K 2201/10128; H05K 5/02; H05K 5/0214; H05K 5/0217; H05K 5/03; H05K 7/20963
USPC ..................................... 361/679.01
See application file for complete search history.

(56) References Cited

U.S. PATENT DOCUMENTS

| | | | |
|---|---|---|---|
| 5,796,570 A | 8/1998 | Mekdhanasarn et al. | |
| 6,721,157 B2 | 4/2004 | Shin | |
| 7,777,400 B2 * | 8/2010 | Kim ......................... | H05K 5/02 |
| | | | 313/46 |
| 10,687,429 B2 * | 6/2020 | Miyanaga .......... | H03K 17/9622 |
| 2001/0002145 A1 * | 5/2001 | Lee ................... | G02F 1/133308 |
| | | | 349/58 |
| 2006/0077129 A1 * | 4/2006 | Kim ......................... | H05K 5/02 |
| | | | 345/60 |

(Continued)

FOREIGN PATENT DOCUMENTS

| | | |
|---|---|---|
| KR | 10-0959128 B1 | 5/2010 |
| KR | 10-2019-0008956 A | 1/2019 |

(Continued)

*Primary Examiner* — Gage Crum
(74) *Attorney, Agent, or Firm* — Womble Bond Dickinson (US) LLP

(57) ABSTRACT

A protection unit includes: a protection member including a metal; and a protection film attached to the protection member. A length of the protection member in a first direction is greater than a length of the protection film in the first direction, and the protection film has grooves at respective edges.

18 Claims, 19 Drawing Sheets

(56)     References Cited

U.S. PATENT DOCUMENTS

| | | | |
|---|---|---|---|
| 2006/0098052 A1* | 5/2006 | Inokuma | B41J 2/33525 |
| | | | 347/64 |
| 2006/0245167 A1* | 11/2006 | Jeong | H05K 5/02 |
| | | | 361/718 |
| 2006/0291153 A1* | 12/2006 | Bae | G06F 1/1601 |
| | | | 361/679.54 |
| 2008/0284765 A1* | 11/2008 | Kim | G06F 1/1601 |
| | | | 345/206 |
| 2009/0080148 A1* | 3/2009 | Sugawara | G02F 1/133308 |
| | | | 361/679.01 |
| 2017/0083273 A1* | 3/2017 | Kim | G02F 1/133317 |
| 2017/0099736 A1* | 4/2017 | Jung | H05K 7/20963 |
| 2017/0371376 A1* | 12/2017 | Chung | H05K 1/028 |
| 2018/0188587 A1* | 7/2018 | Qiu | H10D 86/40 |
| 2019/0380197 A1* | 12/2019 | Lee | H05K 1/028 |
| 2020/0057472 A1* | 2/2020 | Kang | G06F 1/1601 |
| 2020/0135126 A1* | 4/2020 | Yokoyama | G09G 3/3648 |
| 2020/0192431 A1* | 6/2020 | Shin | G06F 1/1626 |
| 2020/0196492 A1* | 6/2020 | Kim | G02F 1/133308 |
| 2021/0068246 A1* | 3/2021 | Park | G02F 1/1345 |
| 2022/0053659 A1* | 2/2022 | Kim | G06F 1/1637 |

FOREIGN PATENT DOCUMENTS

| | | |
|---|---|---|
| KR | 10-2020-0047811 A | 5/2020 |
| KR | 10-2021-0080945 A | 7/2021 |
| KR | 10-2022-0022003 A | 2/2022 |

* cited by examiner 200        310                    300        310

PROTECTION UNIT AND DISPLAY DEVICE INCLUDING THE SAME

CROSS-REFERENCE TO RELATED APPLICATION

This application claims priority to and the benefit of Korean Patent Application No. 10-2022-0027633, filed in the Korean Intellectual Property Office on Mar. 3, 2022, the entire content of which is incorporated by reference herein.

BACKGROUND

1. Field

Aspects of embodiments of the present disclosure relate to a protection unit, and a display device including the protection unit, and more particularly, to a protection unit for covering a driver of a display device.

2. Description of the Related Art

In general, a display device includes a display panel and a gate driver. The display panel includes a display area and a non-display area.

The display area includes data lines, gate lines, and a plurality of pixels formed at points where the data lines cross the gate lines. The pixels receive data voltages of the data lines when gate signals are supplied to the gate lines. The pixels emit light with a predetermined brightness according to the data voltages.

The non-display area is formed around the display area, and includes a pad region. A pad portion is installed in the pad region, and the pad portion is connected to the gate line and the data line in the display area. The pad portion is electrically connected to a driving integrated circuit (IC) and a flexible printed circuit (FPC).

The above information disclosed in this Background section is for enhancement of understanding of the background of the present disclosure, and therefore, it may contain information that does not constitute prior art.

SUMMARY

One or more embodiments of the present disclosure are directed to a display device for improving an arrangement of a protection unit for covering a driver of the display device.

According to one or more embodiments of the present disclosure, a protection unit includes: a protection member including a metal; and a protection film attached to the protection member. A length of the protection member in a first direction is greater than a length of the protection film in the first direction, and the protection film has grooves at respective edges.

In an embodiment, the grooves of the protection film may overlap with the protection member.

In an embodiment, the protection member may have grooves at respective edges; and the grooves of the protection film may be located between the grooves of the protection member.

In an embodiment, the protection film may include an insulating material.

In an embodiment, the protection film may be a lamination of an insulation film and a conductive film.

In an embodiment, the protection member may have a bar shape having a length in a first direction that is greater than a length in a second direction perpendicular to the first direction.

In an embodiment, at least one of the grooves may have a polygonal shape.

In an embodiment, at least one of the grooves may have a curved shape.

According to one or more embodiments of the present disclosure, a protection unit includes: a protection member including a metal; and a protection film attached to the protection member. A length of the protection member in a first direction is greater than a length of the protection film in the first direction; the protection member has grooves at respective edges; the protection film has at least one groove; and the at least one groove of the protection film is between the grooves of the protection member.

According to one or more embodiments of the present disclosure, a display device includes: a display panel including a display area and a non-display area; a driver at the non-display area; and a protection unit on the driver. The protection unit includes: a protection member overlapping with the driver, and a protection film attached to the protection member. A length of the protection member in a first direction is greater than a length of the protection film in the first direction, and the protection film has at least one groove.

In an embodiment, the protection film may have a plurality of grooves at respective edges of the protection film.

In an embodiment, the protection member may have grooves at respective edges; and the at least one groove of the protection film may be between the grooves of the protection member.

In an embodiment, the at least one groove of the protection film may overlap with the protection member.

In an embodiment, the driver may overlap with the protection film and the protection member.

In an embodiment, the protection film may include an insulating material.

In an embodiment, the protection film may be a lamination of an insulation film and a conductive film.

In an embodiment, the protection unit may have a bar shape having a length in a first direction that is greater than a length in a second direction perpendicular to the first direction.

In an embodiment, the at least one groove may have a polygonal shape or a curved shape.

In an embodiment, shapes of the plurality of grooves of the protection film may be different from each other.

In an embodiment, the protection member may include a metal.

According to one or more embodiments of the present disclosure, a display device includes an improved protection unit and arrangement of the protection unit for covering a driver of the display device.

BRIEF DESCRIPTION OF THE DRAWINGS

The above and other aspects and features of the present disclosure will be more clearly understood from the following detailed description of the illustrative, non-limiting embodiments with reference to the accompanying drawings.

DETAILED DESCRIPTION

Figure 1:
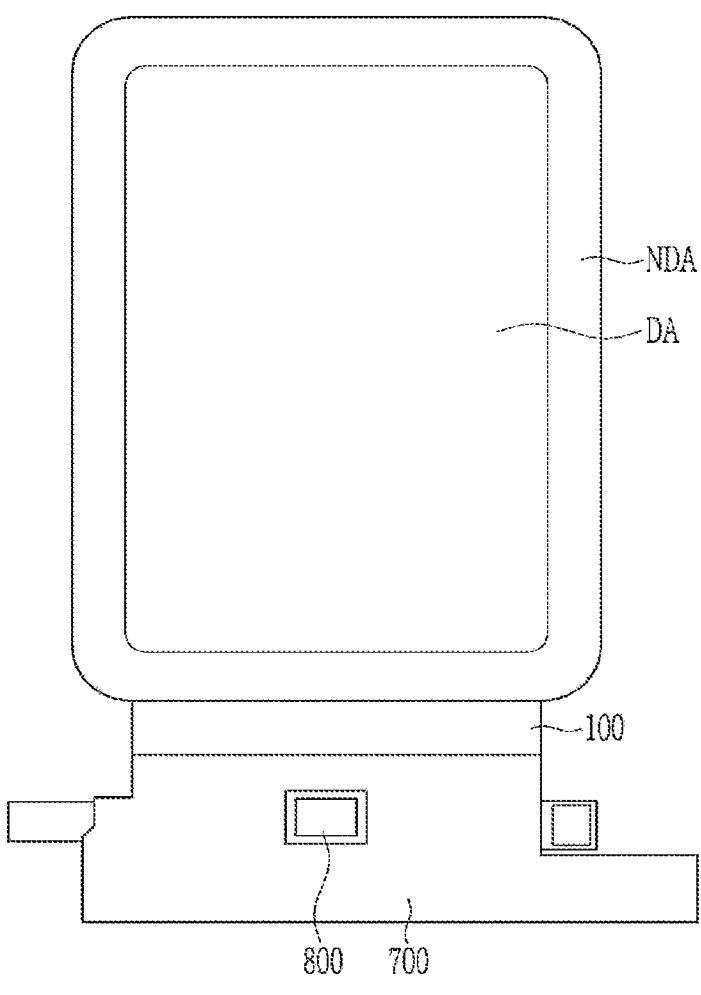
FIG. 1 shows a display device according to an embodiment.

Hereinafter, embodiments will be described in more detail with reference to the accompanying drawings, in which like reference numbers refer to like elements throughout. The present disclosure, however, may be embodied in various different forms, and should not be construed as being limited to only the illustrated embodiments herein. Rather, these embodiments are provided as examples so that this disclosure will be thorough and complete, and will fully convey the aspects and features of the present disclosure to those skilled in the art. Accordingly, processes, elements, and techniques that are not necessary to those having ordinary skill in the art for a complete understanding of the aspects and features of the present disclosure may not be described. Unless otherwise noted, like reference numerals denote like elements throughout the attached drawings and the written description, and thus, redundant description thereof may not be repeated.

When a certain embodiment may be implemented differently, a specific process order may be different from the described order. For example, two consecutively described processes may be performed at the same or substantially at the same time, or may be performed in an order opposite to the described order.

In the drawings, the relative sizes and thicknesses of elements, layers, and regions may be exaggerated and/or simplified for clarity. In the drawings, the thickness of layers, films, panels, regions, and the like are enlarged for clarity. The thicknesses of some layers and areas are exaggerated for convenience of illustration and explanation. Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

As used herein, the phrase "in a plan view" refers to a view of an object portion from the top, and the phrase "in a cross-sectional view" refers to a view of a cross-section of which the object portion is vertically cut from the side.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

It will be understood that when an element or layer is referred to as being "on," "connected to," or "coupled to" another element or layer, it can be directly on, connected to, or coupled to the other element or layer, or one or more intervening elements or layers may be present. Similarly, when a layer, an area, or an element is referred to as being "electrically connected" to another layer, area, or element, it may be directly electrically connected to the other layer, area, or element, and/or may be indirectly electrically connected with one or more intervening layers, areas, or elements therebetween. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments and is not intended to be limiting of the present disclosure. As used herein, the singular forms "a" and "an" are intended to include the plural forms as well, unless the context clearly indicates otherwise. It will be further understood that the terms "comprises," "comprising," "includes," "including," "has," "have," and "having," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. For example, the expression "A and/or B" denotes A, B, or A and B. Expressions such as "at least one of," when preceding a list of elements, modify the entire list of elements and do not modify the individual elements of the list. For example, the expression "at least one of a, b, or c," "at least one of a, b, and c," and "at least one selected from the group consisting of a, b, and c" indicates only a, only b, only c, both a and b, both a and c, both b and c, all of a, b, and c, or variations thereof.

As used herein, the term "substantially," "about," and similar terms are used as terms of approximation and not as terms of degree, and are intended to account for the inherent variations in measured or calculated values that would be recognized by those of ordinary skill in the art. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively. Also, the term "exemplary" is intended to refer to an example or illustration.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

FIG. 1 shows a display device according to an embodiment. Referring to FIG. 1, the display device may include a display area DA for displaying images, a non-display area NDA positioned around (e.g., a periphery of) the display area, a driver 100 positioned at (e.g., in or on) the non-display area NDA, and a connection film 700. Other constituent elements of the display device may be attached to the connection film 700. FIG. 1 shows a configuration in which a circuit unit (e.g., a circuit or an integrated circuit) 800 is attached to the connection film 700. The circuit unit 800 may be a system in package (SIP) of an ultra-flexible printed circuit (UFPC) connected to a panel assembly (panel+UFPC). However, the present disclosure is not limited thereto, and various suitable components may be attached to the connection film 700.

As shown in FIG. 1, the driver 100 is positioned at (e.g., in or on) an edge of the display device. Thus, to prevent or substantially prevent the driver 100 from being damaged, a protection unit including a protection member and a protection film may overlap with the driver 100. The protection unit including the protection member and the protection film will now be described in more detail hereinafter.

Figure 2:
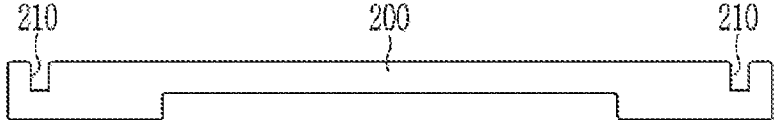
FIG. 2 shows a configuration of a protection member.
Figure 3:
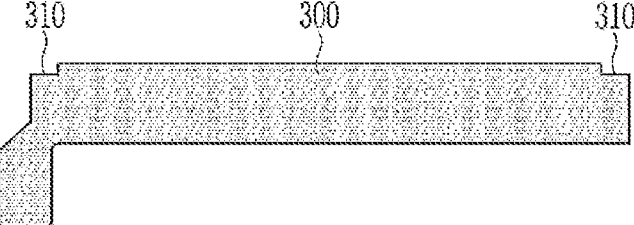
FIG. 3 shows a configuration of a protection film.

FIG. 2 shows a configuration of a protection member 200, and FIG. 3 shows a configuration of a protection film 300. Referring to FIG. 2, the protection member 200 may have a bar shape including a plurality of grooves 210. The protection member 200 may be made of a rigid material, such as a metal, and may physically protect the driver 100. For example, the protection member 200 may be made of stainless steel, but is not limited thereto. When the protection member 200 is attached to the driver 100, it may protect the driver 100 from external physical impacts.

FIG. 3 shows a configuration of a protection film 300. The protection film 300 may include grooves 310 positioned at (e.g., in or on) respective edges (e.g., opposite edges). The grooves 310 are illustrated to have a quadrangular shape in FIG. 3, but the present disclosure is not limited thereto. The protection film 300 includes the grooves 310 at (e.g., in or on) the respective edges, so an arrangement of the driver 100, the protection member 200, and the protection film 300 in a laminating process may be accurately measured, which will be described in more detail below.

The protection film 300 may prevent or substantially prevent the inflow of static electricity into the display device. The protection film 300 may be made of an insulation material, or may be generated by laminating an insulation film and a conductive film. The static electricity input from the outside may be blocked by the protection film 300, or may be absorbed into the protection film 300. The driver and the display device may be protected from the external static electricity.

Figure 4:
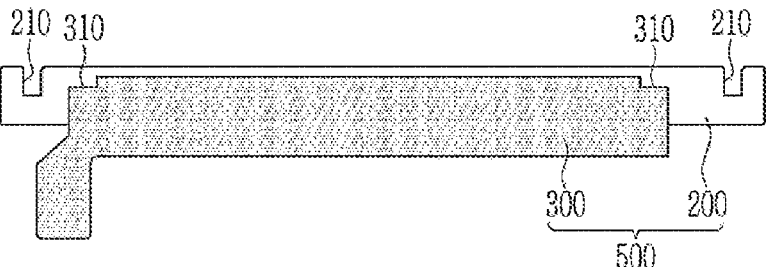
FIG. 4 shows a protection unit including a combination of a protection member and a protection film.

FIG. 4 shows a protection unit 500 including a combination of a protection member 200 and a protection film 300. In the process for attaching the protection member 200 and the protection film 300 to the display device, the protection member 200 and the protection film 300 may be attached to the display device according to individual processes, or may be attached to the display device as the protection unit 500 including the protection member 200 and the protection film 300 that are laminated together as shown in FIG. 4. When the protection unit 500 including the protection member 200 and the protection film 300 that are laminated together is attached to the display device as shown in FIG. 4, the process may be simplified as attaching quality thereof may be improved.

Referring to FIG. 4, the grooves 310 of the protection film 300 may be positioned between the grooves 210 of the protection member 200. In other words, the grooves 210 of the protection member 200 may be positioned at (e.g., in or on) the respective edges, and the grooves 310 of the protection film 300 may be positioned therebetween.

Figure 5:
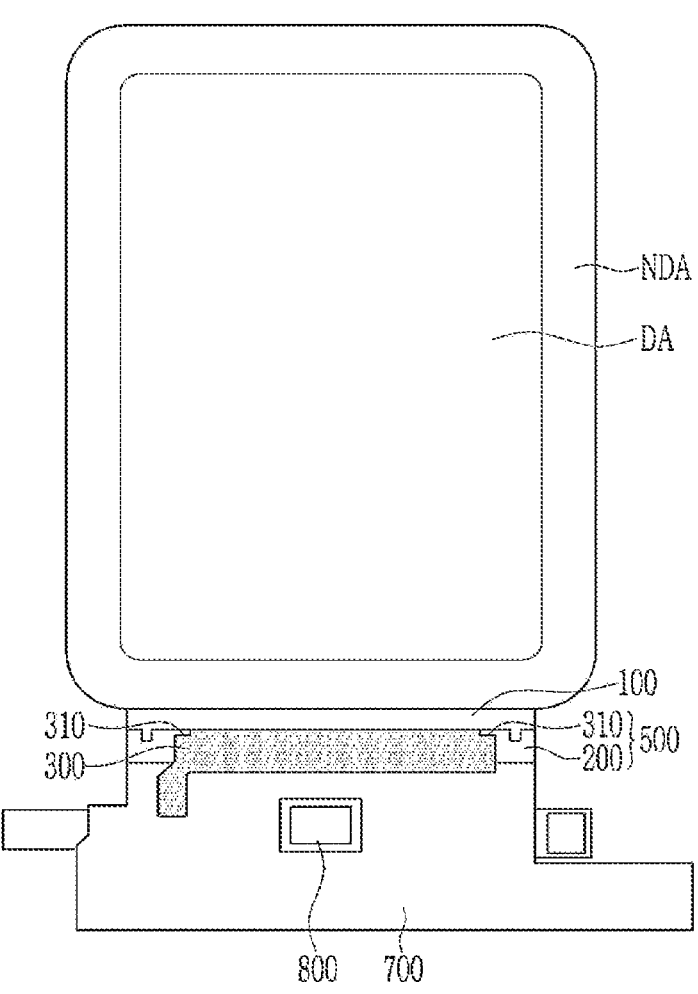
FIG. 5 shows a configuration of a display device attached to a protection unit, in which a protection member and a protection film are laminated, according to an embodiment.

FIG. 5 shows a configuration of a display device attached to a protection unit 500, in which a protection member 200 and a protection film 300 are laminated, according to an embodiment. As shown in FIG. 5, the driver 100 (e.g., see also, FIG. 1) is covered by the protection member 200 and the protection film 300. Therefore, the driver 100 may be physically protected by the protection member 200, and may be physically protected by the protection film 300.

Referring again to FIG. 3, the protection film 300 includes the grooves 310 positioned at (e.g., in or on) the respective edges. Therefore, the arrangement of the display device, the protection member 200, and the protection film 300 may be accurately measured.

Figure 6:
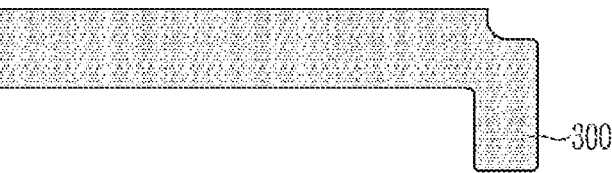
FIG. 6 shows another embodiment of a protection film that does not have grooves positioned at respective sides.
Figure 7:
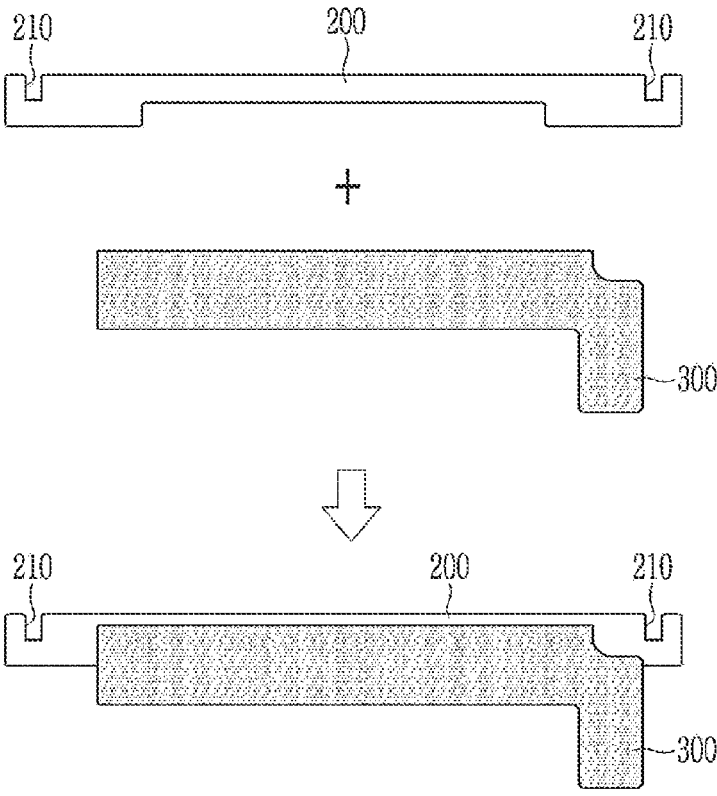
FIG. 7 shows an embodiment of the protection film of FIG. 6 and a protection member that are correctly laminated.
Figure 8:
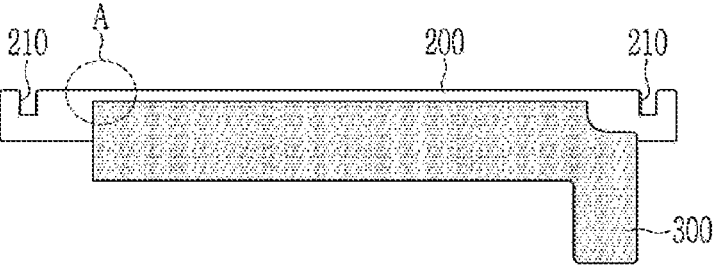
FIG. 8 shows an embodiment in which a protection film of FIG. 6 and a protection member move upward in a laminating process.
Figure 9:
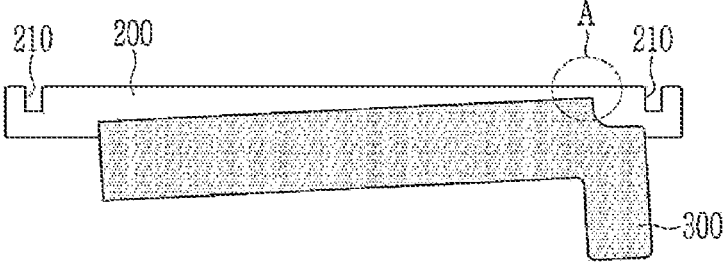
FIG. 9 shows an embodiment in which a protection film and a protection member are attached with a slant in a laminating process.

FIG. 6 shows an embodiment of a protection film 300 that does not have grooves positioned at respective sides. FIG. 7 shows an embodiment of the protection film 300 of FIG. 6 and a protection member 200 that are correctly laminated. FIG. 8 shows an embodiment in which a protection film 300 of FIG. 6 and a protection member 200 move upward in a laminating process. FIG. 9 shows an embodiment in which a protection film 300 and a protection member 200 are attached with a slant in a laminating process. Portions of the protection unit in which the protection member 200 and the protection film 300 are not well attached to each other are marked with the reference symbol A in FIG. 8 and FIG. 9.

In the case of the configuration shown in FIG. 8 and FIG. 9, the protection film 300 and the protection member 200 are not completely attached to the display device, which may not be included in a category of defects.

However, when the protection film 300 has no grooves at (e.g., in or on) the respective sides as shown in FIG. 6 to FIG. 9, an arrangement recognizing device may fail to distinguish and recognize the edge of the protection film 300 and the edge of the protection member 200, and cases that are not defects may be recognized as defects.

Figure 10:
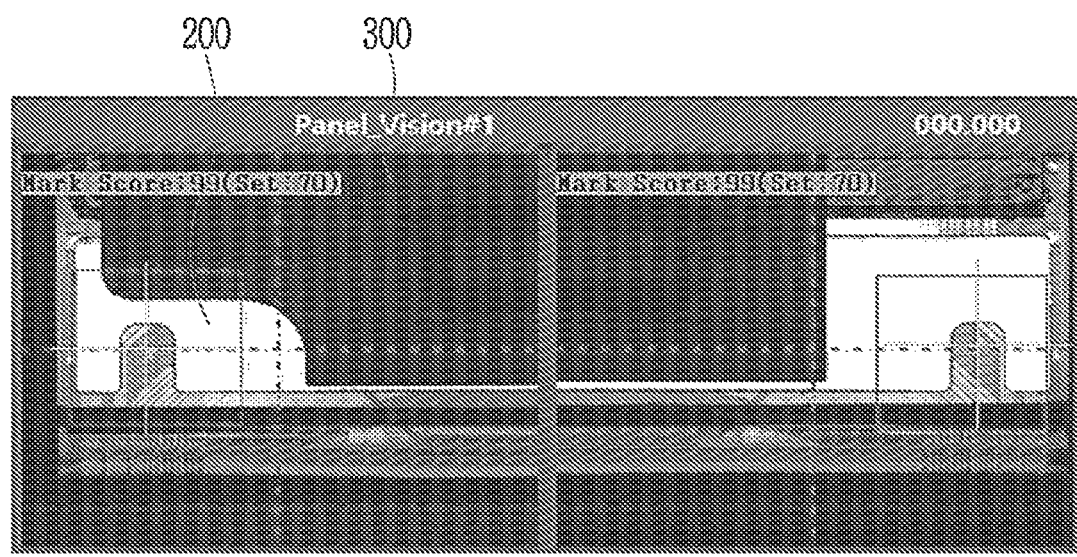
FIG. 10 shows an image of a display device in which a protection member and a protection film are correctly arranged.
Figure 11:
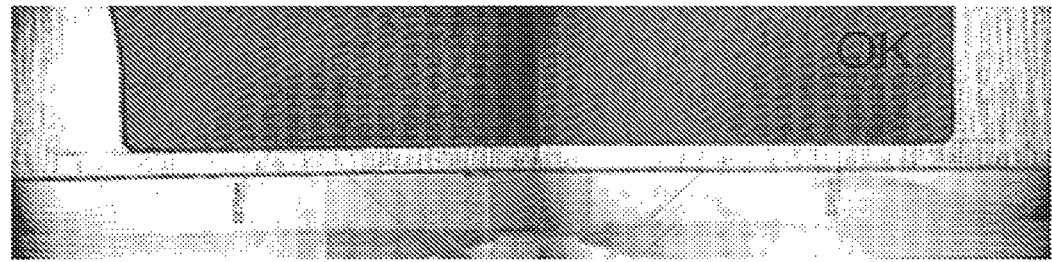
FIG. 11 shows a result of recognizing a display device of FIG. 10 with an arrangement recognizing device.

FIG. 10 shows an image of a display device in which a protection member 200 and a protection film 300 are correctly arranged, and FIG. 11 shows a result of recognizing a display device of FIG. 10 with an arrangement recognizing device. Referring to FIG. 10 and FIG. 11, the arrangement recognizing device recognizes that the arrangement of the protection member 200 and the protection film 300 is well performed.

Figure 12:
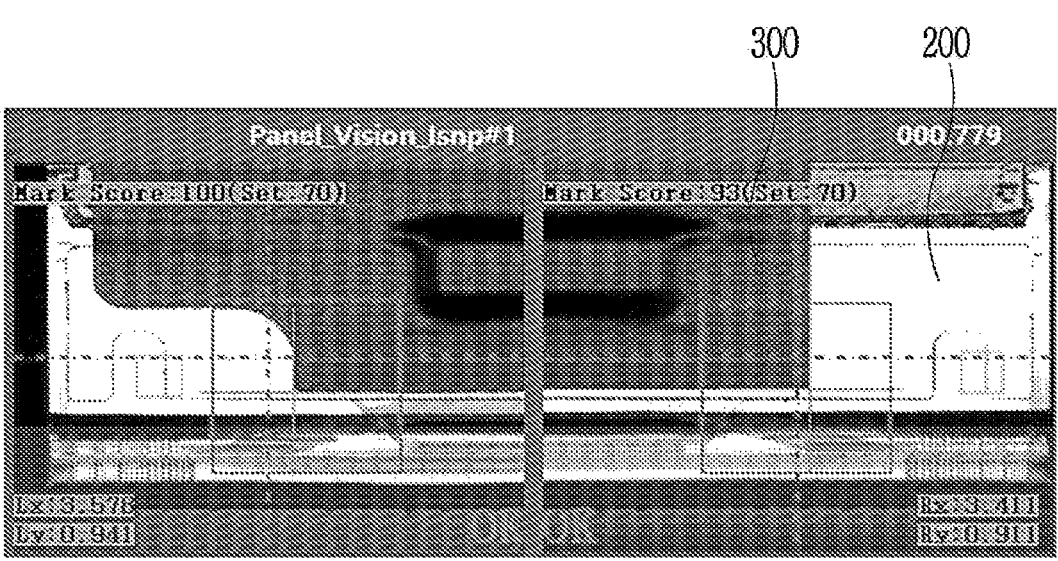
FIG. 12 shows an image of a display device satisfying a standard while a protection member and a protection film are not completely arranged.

FIG. 12 shows an image of a display device satisfying a standard while a protection member 200 and a protection film 300 are not completely arranged. In the case shown in FIG. 12, an arrangement error is not 0, but the edge of the protection film 300 is positioned within the edge (e.g., between the edges) of the protection member 200, which is not a defect.

Figure 13:
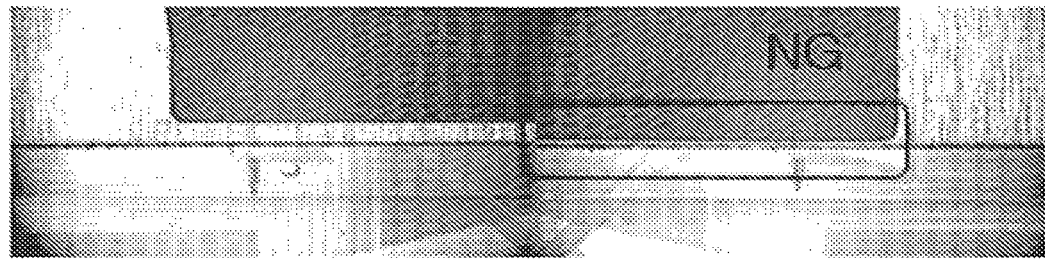
FIG. 13 shows a result of recognizing a display device of FIG. 12 with an arrangement recognizing device.

FIG. 13 shows a result of recognizing a display device of FIG. 12 with an arrangement recognizing device. Referring to FIG. 13, the arrangement recognizing device recognizes that the arrangement shown in FIG. 12 is not well performed. In other words, in FIG. 12, the protection film 300 is positioned within (e.g., the edges of) the protection member 200, such that the edge of the protection film 300 does not go (e.g., does not extend) outside of the protection member 200, and thus, is not a defect. However, because the arrangement recognizing device may not distinguish and recognize the edge of the protection film 300 and the edge of the protection member 200, it may determine that the protection film 300 escapes the protection member 200 as shown in FIG. 13.

In other words, the arrangement recognizing device may fail to distinguish and recognize the edge of the protection film 300 and the edge of the protection member 200 as described above, so that even the case that the arrangement is not a defect may be determined to be a defect, which causes a delay and loss of the process.

However, the display device according to one or more embodiments of the present disclosure includes the protection film 300 having the groove 310 that may be used for recognition of the edge of the protection film 300. Therefore, the arrangement recognizing device may distinguish and recognize the edge of the protection film 300 and the edge of the protection member 200, thereby increasing accuracy of determining defects and processing efficiency.

Figure 14:
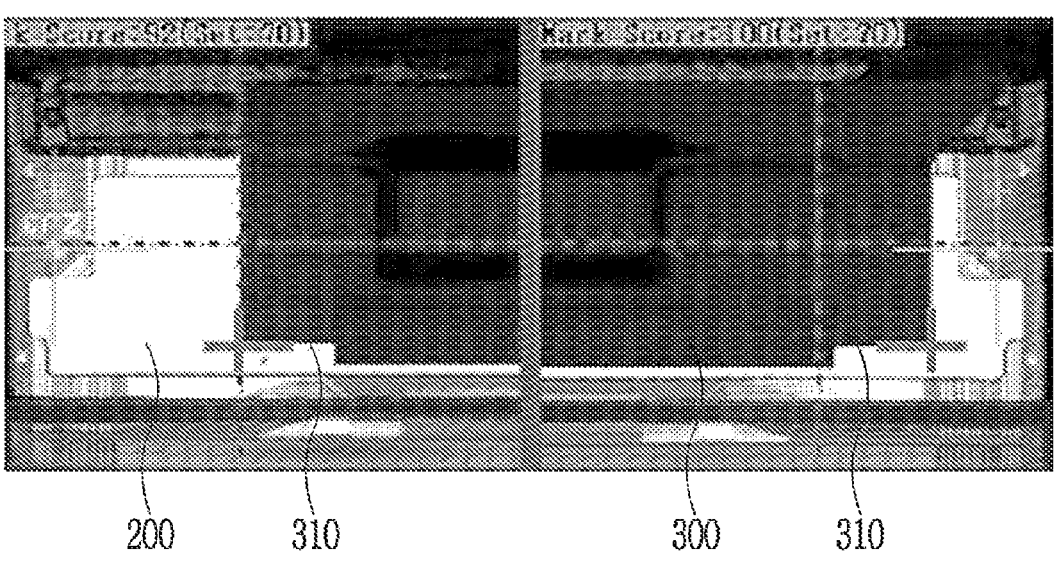
FIG. 14 shows a method for recognizing a protection film having grooves at respective sides as shown in FIG. 3.

FIG. 14 shows a method for recognizing a protection film 300 having grooves at respective sides as shown in FIG. 3. Referring to FIG. 14, the arrangement recognizing device recognizes the groove 310 of the protection film 300 as a reference, thereby distinguishing and recognizing the edge of the protection film 300 and the edge of the protection member 200. Thus, the arrangement of the protection film 300 and the protection member 200 may be accurately checked.

FIG. 3 and FIG. 4 show a configuration in which the grooves 310 positioned at (e.g., in or on) the respective sides of the protection film 300 have a quadrangular shape, but the present disclosure is not limited thereto, and in other embodiments, the shape of the groove 310 may be variously modified.

Figure 15:
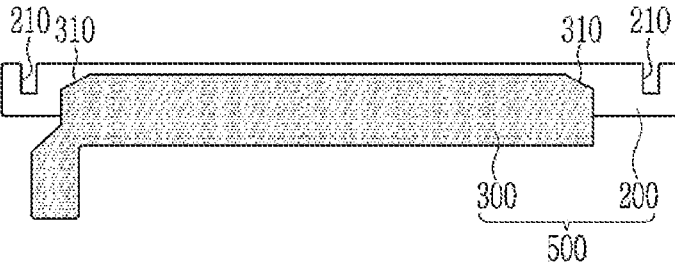
FIG. 15 shows a protection unit including a protection member and a protection film that are laminated according to another embodiment.

FIG. 15 shows a protection unit 500 including a protection member 200 and a protection film 300 that are laminated according to another embodiment. Referring to FIG. 15, the protection film 300 may have triangular shaped grooves 310. In other words, FIG. 3 and FIG. 4 show the grooves 310 configured by removing respective quadrangular shaped edges of the protection film 300, and FIG. 15 show the grooves 310 configured by removing respective triangular shaped edges of the protection film 300. In this case, the edge of the protection film 300 and the edge of the protection member 200 are distinguished and recognized as described above, so the arrangement of the protection film 300 and the protection member 200 may be accurately checked.

Figure 16:
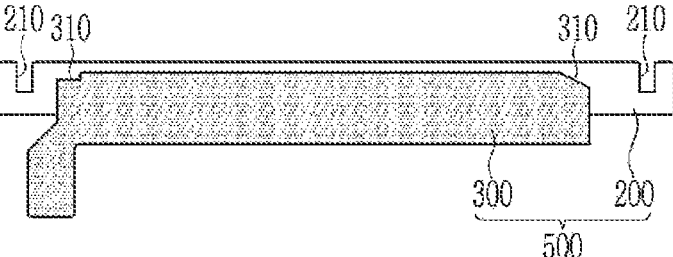
FIG. 16 shows a protection unit including a protection member and a protection film that are laminated according to another embodiment.

FIG. 16 shows a protection unit 500 including a protection member 200 and a protection film 300 that are laminated according to another embodiment. One groove 310 may have a quadrangular shape, and the other groove 310 may have a triangular shape. In this case, the edge of the protection film 300 and the edge of the protection member 200 are distinguished and recognized as described above, so the arrangement of the protection film 300 and the protection member 200 may be accurately checked.

Figure 17:
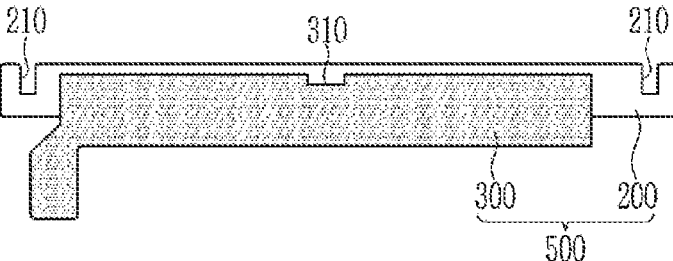
FIG. 17 shows a protection unit including a protection member and a protection film that are laminated according to another embodiment.

FIG. 17 shows a protection unit 500 including a protection member 200 and a protection film 300 that are laminated according to another embodiment. A groove 310 may be positioned at (e.g., in or on) a portion of the protection film 300, instead of at (e.g., in or on) the edge of the protection film 300. As shown in FIG. 17, the groove 310 may be positioned near a center of the protection film 300. In this case, the edge of the protection film 300 and the edge of the protection member 200 are distinguished and recognized as described above, so the arrangement of the protection film 300 and the protection member 200 may be accurately checked.

Figure 18:
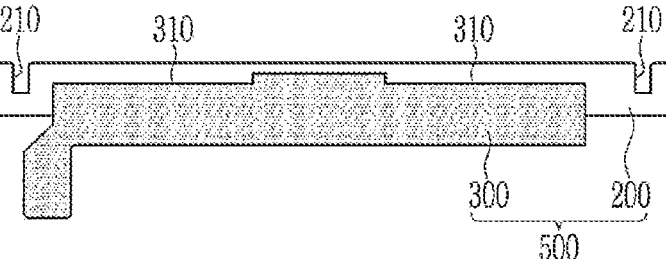
FIG. 18 shows a protection unit including a protection member and a protection film that are laminated according to another embodiment.

FIG. 18 shows a protection unit 500 including a protection member 200 and a protection film 300 that are laminated according to another embodiment. The grooves 310 shown in FIG. 18 are formed to be wider than the grooves 310 shown in FIG. 3 and FIG. 4. In other words, when the grooves 310 are positioned at (e.g., in or on) a part of the edge in the embodiment described above with reference to FIG. 3 and FIG. 4, portions occupied by the grooves 310 may be longer than portions at (e.g., in or on) which the grooves 310 are not positioned in the case of FIG. 18. In this case, the edge of the protection film 300 and the edge of the protection member 200 are distinguished and recognized, so the arrangement of the protection film 300 and the protection member 200 may be accurately checked.

Figure 19:
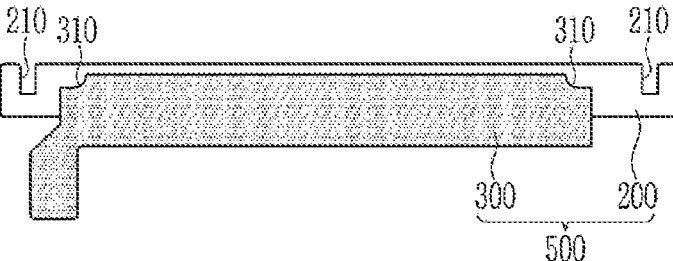
FIG. 19 shows a protection unit including a protection member and a protection film that are laminated according to another embodiment.

FIG. 19 shows a protection unit 500 including a protection member 200 and a protection film 300 that are laminated according to another embodiment. The groove 310 may have a circular shape, oval shape, or curved shape. In this case, the edge of the protection film 300 and the edge of the protection member 200 are distinguished and recognized as described above, so the arrangement of the protection film 300 and the protection member 200 may be accurately checked.

For more accurate recognition, it may be desirable for the grooves 310 to have a polygonal shape having straight lines and angles. This is because the arrangement recognizing device may recognize the arranged degrees through the straight lines or respective portions of the grooves 310, and also because it may have difficulty in recognition when the grooves 310 are curved.

The various shapes of the grooves 310 according to various embodiments have been described above with reference to FIG. 3, FIG. 4, and FIG. 15 through FIG. 19, but the present disclosure is not limited thereto, and any suitable kind (e.g., suitable shapes) of grooves from which part of the protection film 300 is removed may be included within the spirit and scope of the present disclosure.

As described above, according to one or more embodiments of the present disclosure, the protection member 200 and the protection film 300 may be attached to the driver 100, and may physically and electrically protect the driver 100. According to one or more embodiments, the protection member 200 and the protection film 300 may be first laminated together, and may be attached to the driver 100 as the protection unit 500 to simplify a process. Further, according to one or more embodiments, the protection film 300 may include grooves 310 positioned at (e.g., in or on) respective edges (e.g., opposite edges) or near a center of the protection film 300, and the edge of the protection film 300 and the edge of the protection member 200 may be distinguished and recognized by the grooves 310 of the protection film 300. Accordingly, the arrangement of the protection film 300 and the protection member 200 may be accurately checked.

Although some embodiments have been described, those skilled in the art will readily appreciate that various modifications are possible in the embodiments without departing from the spirit and scope of the present disclosure. It will be understood that descriptions of features or aspects within each embodiment should typically be considered as available for other similar features or aspects in other embodiments, unless otherwise described. Thus, as would be apparent to one of ordinary skill in the art, features, characteristics, and/or elements described in connection with a particular embodiment may be used singly or in combination with features, characteristics, and/or elements described in connection with other embodiments unless otherwise specifically indicated. Therefore, it is to be understood that the foregoing is illustrative of various example embodiments and is not to be construed as limited to the specific embodiments disclosed herein, and that various modifications to the disclosed embodiments, as well as other example embodiments, are intended to be included within the spirit and scope of the present disclosure as defined in the appended claims, and their equivalents.

DESCRIPTION OF SYMBOLS

| | |
|---|---|
| 100: driver | 200: protection member |
| 210: groove | 300: protection film |
| 310: groove | 500: protection unit |

What is claimed is:

1. A protection unit comprising: a protection member comprising a metal; and a protection film attached to a first surface of the protection member, wherein a length of the protection member in a first direction is greater than a length of the protection film in the first direction, wherein the protection film has grooves at respective edges, wherein a first side of the protection film in a second direction perpendicular to the first direction overlaps with the protection member, and a second side of the protection film opposite to the first side in the second direction does not overlap with the protection member, wherein no part of the protection member extends farther than the second side of the protection film in the second direction, wherein the grooves of the protection film are located at the first side of the protection film, wherein the protection member has a first side in the second direction adjacent to the first side of the protection film, and a second side opposite the first side in the second direction that overlaps with the protection film, wherein the protection member has grooves that are recessed in the first side and in the first surface of the protection member and that are adjacent to opposite edges of the protection member, wherein the grooves of the protection film are located between the grooves of the protection member along the first direction, and wherein the grooves of the protection member are recessed farther toward the second side of the protection member than the grooves of the protection film.

2. The protection unit of claim 1, wherein the grooves of the protection film overlap with the protection member.

3. The protection unit of claim 1, wherein the protection film comprises an insulating material.

4. The protection unit of claim 1, wherein the protection film is a lamination of an insulation film and a conductive film.

5. The protection unit of claim 1, wherein the protection member has a bar shape having the length in the first direction that is greater than a length in the second direction.

6. The protection unit of claim 1, wherein at least one of the grooves of the protection film have a polygonal shape.

7. The protection unit of claim 1, wherein at least one of the grooves of the protection film have a curved shape.

8. A protection unit comprising: a protection member comprising a metal; and a protection film attached to a first surface of the protection member, wherein: a length of the protection member in a first direction is greater than a length of the protection film in the first direction; the protection member has grooves at respective adjacent to opposite edges; the protection film has at least one groove; the at least one groove of the protection film is between the grooves of the protection member along the first direction; a first side of the protection film in a second direction perpendicular to the first direction overlaps with the protection member, and a second side of the protection film opposite to the first side in the second direction does not overlap with the protection member; and no part of the protection member extends farther than the second side of the protection film in the second direction, wherein the at least one groove of the protection film is located at the first side of the protection film, wherein the protection member has a first side in the second direction adjacent to the first side of the protection film, and a second side opposite the first side in the second direction that overlaps with the protective film, wherein the grooves of the protection member are recessed in the first side and the first surface of the protection member, and wherein the grooves of the protection member are recessed farther toward the second side of the protection member than the grooves of the protection film.

9. A display device comprising: a display panel comprising a display area and a non-display area; a driver at the non-display area; and a protection unit on the driver at the non-display area, and not overlapping with the display area, wherein the protection unit comprises: a protection member overlapping with the driver, and a protection film attached to a first surface of the protection member, wherein a length of the protection member in a first direction is greater than a length of the protection film in the first direction, wherein the protection film has at least one groove, an entirety of the at least one groove overlapping with the protection member to expose a part of the protection member, wherein the protection member has a first side in a second direction, perpendicular to the first direction, adjacent to the first side of the protection film, and a second side opposite the first side in the second direction that overlaps with the protection film, and wherein the protection member has grooves that are recessed in the first side and in the first surface of the protection member, wherein the at least one groove of the protection film is located between the grooves of the protection member along the first direction, and wherein the grooves of the protection member are recessed farther toward the second side of the protection member than the at least one groove of the protection film.

10. The display device of claim 9, wherein the protection film has a plurality of grooves at respective edges of the protection film.

11. The display device of claim 9, wherein: the protection member has the grooves at respective edges.

12. The display device of claim 9, wherein the driver overlaps with the protection film and the protection member.

13. The display device of claim 9, wherein the protection film comprises an insulating material.

14. The display device of claim 9, wherein the protection film is a lamination of an insulation film and a conductive film.

15. The display device of claim 9, wherein the protection unit has a bar shape having a length in the first direction that is greater than a length in a second direction perpendicular to the first direction.

16. The display device of claim 9, wherein the at least one groove has a polygonal shape or a curved shape.

17. The display device of claim 10, wherein shapes of the plurality of grooves of the protection film are different from each other.

18. The display device of claim 9, wherein the protection member comprises a metal.

\* \* \* \* \*